(12) United States Patent
Hehemann et al.

(10) Patent No.: US 7,141,833 B2
(45) Date of Patent: Nov. 28, 2006

(54) PHOTODIODE

(75) Inventors: Ingo Hehemann, Duisburg (DE); Armin Kemna, Duisburg (DE)

(73) Assignee: Thomson Licensing SAS, Boulogne-Billancourt (FR)

( * ) Notice: Subject to any disclaimer, the term of this patent is extended or adjusted under 35 U.S.C. 154(b) by 181 days.

(21) Appl. No.: 10/993,588

(22) Filed: Nov. 19, 2004

(65) Prior Publication Data

US 2005/0156182 A1   Jul. 21, 2005

Related U.S. Application Data

(63) Continuation of application No. PCT/EP03/05378, filed on May 22, 2003.

(30) Foreign Application Priority Data

May 24, 2002   (DE) ............... 102 23 202

(51) Int. Cl.
  *H01L 31/0328*   (2006.01)
(52) U.S. Cl. .............. 257/184; 257/222; 257/226; 257/291; 257/461; 257/509; 257/927
(58) Field of Classification Search .............. None
  See application file for complete search history.

(56) References Cited

U.S. PATENT DOCUMENTS

| | | | |
|---|---|---|---|
| 4,910,570 A | 3/1990 | Popovic | |
| 5,049,962 A | 9/1991 | Huang et al. | |
| 5,097,307 A | 3/1992 | Bierhoff | |
| 5,144,381 A | * 9/1992 | Furuyama et al. | 257/186 |
| 5,566,151 A | 10/1996 | Bates et al. | |
| 5,701,283 A | 12/1997 | Alon et al. | |
| 5,774,432 A | 6/1998 | Alon et al. | |
| 5,859,462 A | 1/1999 | Tredwell et al. | |
| 5,861,655 A | 1/1999 | Kozuka et al. | |
| 6,133,615 A | 10/2000 | Guckel et al. | |

(Continued)

FOREIGN PATENT DOCUMENTS

DE    4442853    10/1995

(Continued)

OTHER PUBLICATIONS

Freeman, et al. Robust Focus and Tracking Detection for Holographic Digital Versatile Disc Optical Pickup-Head Modules. Journal of Applied Physics. 1999. Japan.

(Continued)

*Primary Examiner*—Wai-Sing Louie
(74) *Attorney, Agent, or Firm*—Michael A. Glenn; Glenn Patent Group

(57) ABSTRACT

Apart from a semiconductor substrate and a photosensitive region in the semiconductor substrate, which comprises a space charge zone region for generating a diffusion current portion and a diffusion region for generating a diffusion current portion, a photodiode includes an insulation means in the semiconductor substrate for at least partially confining the diffusion region against an adjacent surrounding region of the semiconductor substrate. The reduction of the bandwidth of photodiodes by the smearing of the response of the photodiode by the diffusion current is alleviated by providing an insulation means in the semiconductor substrate, which confines the diffusion region against the surrounding semiconductor substrate and hereby on the one hand reduces the number of charge carriers contributing to the diffusion portion by reducing the diffusion region, in which the diffusing charge carriers are generated, and on the other hand by "sucking off" diffusing charge carriers generated in the shrunk diffusion region by the insulation means, which is why same do not contribute to the photocurrent.

9 Claims, 8 Drawing Sheets

U.S. PATENT DOCUMENTS 6,646,976 B1    11/2003    Chung et al.
2003/0227064 A1*  12/2003  Maeda ...................... 257/431

FOREIGN PATENT DOCUMENTS

| EP | 0296371 | 12/1988 |
|----|---------|---------|
| EP | 0405670 | 1/1991  |
| EP | 0556000 | 8/1993  |
| EP | 0660414 | 6/1995  |
| EP | 0855743 | 7/1998  |
| EP | 1028412 | 8/2000  |
| WO | WO99/53547 | 10/1999 |
| WO | WO03/100365 | 12/2003 |

OTHER PUBLICATIONS

Linten, et al. Integrated Optical Receiver with Beam Localisation. Electronics Letters. May 9, 2002. vol. 38. No. 10.

Rooman, et al. Asynchronous 250-Mb/s Optical Receivers with Integrated Detector in Standard CMOS Technology for Optocoupler Applications. IEEE Journal of Solid State Circuits. vol. 35. No. 7, Jul. 2000.

* cited by examiner

PHOTODIODE

CROSS-REFERENCE TO RELATED APPLICATION

This application is a continuation of co-pending International Application No. PCT/EP03/05378, filed May 22, 2003, which designated the United States and was not published in English and is incorporated herein by reference in its entirety.

BACKGROUND OF THE INVENTION

1. Field of the Invention

The present invention relates to a photodiode and, in particular, to fast photodiodes as are, for example, utilized in optical memories and in optical communications.

2. Description of the Related Art

Photodiodes are applied in various fields. Photodiodes are, for example, employed in X-ray detectors, camera sensors, triangulation sensors, optocouplers, monitoring devices, optical memories and optical transmission systems. In particular in the last-mentioned fields of application, photodiodes enabling signal processing in the megahertz to gigahertz region are required.

A photodiode utilizes the electrical field of a pn junction to capture charge carriers generated by light or to separate electron/hole pairs. The resulting photocurrent is composed of a drift portion and a diffusion portion. The. drift portion is formed by charge carriers generated in the space-charge zone of the pn junction and thus detected directly via the photocurrent. The drift portion of the photocurrent generated in this way has a bandwidth in the gigahertz region.

The diffusion current is formed by charge carriers generated outside the space-charge zone. After being generated, the charge carriers diffuse through the substrate due to a lacking field impact without an electromotive force and are detected at a time interval, offset from the generation, depending on the diffusion length. The bandwidth of this diffusion portion is considerably smaller than that of the drift current portion, namely smaller than about 10 MHz.

The percentage of the drift portion compared to the entire photocurrent approaches zero for large wavelengths. With an increasing wavelength, the bandwidth of the photocurrent consequently corresponds to the bandwidth of the diffusion portion. In contrast, the sensitivity of photodiodes at first increases with an increasing wavelength. The reason for this is that the penetration depth of light on the one hand increases with an increasing wavelength and that the recombination of charge carriers at the surface on the other hand is higher than in charges generated in deeper regions. The result is an increase in sensitivity or responsivity of the photodiodes with an increasing wavelength Starting at a certain wavelength at about 650 nm, the sensitivity of the photodiode, however, decreases with further increasing wavelengths since, due to the still greater penetration depth of long-wave light, charge carriers are generated in even deeper regions and the charge carriers generated in even deeper regions and diffusing towards the space-charge zone of the photodiode can no longer reach the space-charge zone of the photodiode before recombining.

Up to now, ways of addressing the problem of a limited bandwidth in systems requiring a photodiode having a bandwidth of several megahertz have been to fall back on discrete photodiodes produced by means of expensive special processes. Apart from the expenses for the external devices, this causes further expenses for example due to additional casing pins, bond pads, high-area and high-current input/output interfaces and additional printed circuit board area.

An alternative solution allowing fast photodiodes without modifying a process is described by Cathleen Rooman et al in "Asynchronous 250-Mb/s Optical Receivers with Integrated Detector in Standard CMOS Technology for Optocopler Applications," IEEE Journal of Solid State Circuits, vol. 35, No. 7, July 2000. In order to optimize speed without modifying a process, half of the diode area is used to detect the diffusion current. Additional circuit blocks calculating the diffusion portion from the photocurrent comprising a diffusion and a drift current portion are provided for this. The disadvantage of this procedure is that about half of the light power is employed for detecting the diffusion current. Furthermore, there are several non-amplifying devices in the signal path, which in turn means a considerable deterioration of the noise features of the read-out. In particular in communications and optical memory systems, noise is a critical parameter so that the procedure used there can only be employed in such systems under certain circumstances.

Another disadvantage of prior-art photodiodes generated on the process level is that they exhibit, as has been described before, a sensitivity characteristic curve which depending on the wavelength is not constant. A linearization of the sensitivity could, for example, be desired for reasons of compatibility in optical memory systems in which data is read out from data carriers, which can be archived, in different devices by means of light sources having different wavelengths. Up to now, such a linearization has only been achieved on the side of signal processing by means of complex circuit blocks, such as, for example, digital signal processors.

SUMMARY OF THE INVENTION

It is the object of the present invention to provide a photodiode enabling a faster read-out.

In accordance with a first aspect, the present invention provides a photodiode, having a semiconductor substrate; a photosensitive region in the substrate, the photosensitive region having a space charge zone region for generating a drift current portion and a diffusion region for generating a diffusion current portion; and an insulator in the semiconductor substrate for at least partially confining the diffusion region from an adjacent surrounding region of the semiconductor substrate.

Apart from a semiconductor substrate and a photo-sensitive region in the semiconductor substrate comprising a space-charge zone region for generating a diffusion current portion and a diffusion region for generating a diffusion current portion, the inventive photodiode includes insulation means in the semiconductor substrate for at least partly localizing the diffusion region with regard to an adjacent surrounding region of the semiconductor substrate.

The present invention is based on the finding that decreasing the bandwidth of photodiodes by blurring the response of the photodiode by the diffusion current can be reduced by providing insulation means in the semiconductor substrate, which localizes the diffusion region with regard to the adjacent semiconductor substrate and reduces the number of charge carriers contributing to the diffusion portion, on the one hand, by decreasing the diffusion region in which the diffused charge carriers are generated and, on the other hand, by "sucking" diffusing charge carriers generated in the smaller diffusion region by means of the insulation means, which is why they do not contribute to the photocurrent.

In accordance with an embodiment of the present invention, the semiconductor substrate is of a first conductivity type, the space-charge zone region is formed by a signal region having a second conductivity type in the semiconductor substrate and the insulation means is formed by an insulation region of a second conductivity type in the semiconductor substrate in a predetermined spacing to the signal region. In a special embodiment of the present invention where a plurality of photo-sensitive regions are arranged as a photodiode array, insulation regions are arranged such that they localize every photodiode formed by a respective photo-sensitive region with regard to its diffusion region and shield each photo-sensitive region of a photodiode from charge carriers diffusing from a neighboring diffusion region of a neighboring photodiode. The insulation regions in the semiconductor substrate form space-charge zones and thus themselves form detecting diodes also used for read-out. In this way, an array of fast photodiodes having a small diffusion and a large drift current portion, which subsequently will be referred to as RF diodes, is formed, the array being interspersed by an array of slow detection diodes having a high diffusion current portion, which subsequently will be referred to as LF diodes. Another advantage is that the sensitivity characteristic curve of the photodiode is made constant over the wavelength with a simultaneous read-out of the photocurrent provided by the RF diodes and of the photocurrent generated by the LF diode formed by the insulation region.

BRIEF DESCRIPTION OF THE DRAWINGS

Preferred embodiments of the present invention will be detailed subsequently referring to the appended drawings, in which:

FIG. 2b shows a block diagram of the read-out and control part of the optical scanner of FIG. 2a;

FIG. 3b shows a sectional plane through the layout of FIG. 3a;

FIG. 4 shows a simulation result for the dark current forming along the sectional plane of FIG. 3b in the layout of FIG. 3a;

DESCRIPTION OF THE PREFERRED EMBODIMENTS

Figure 1:
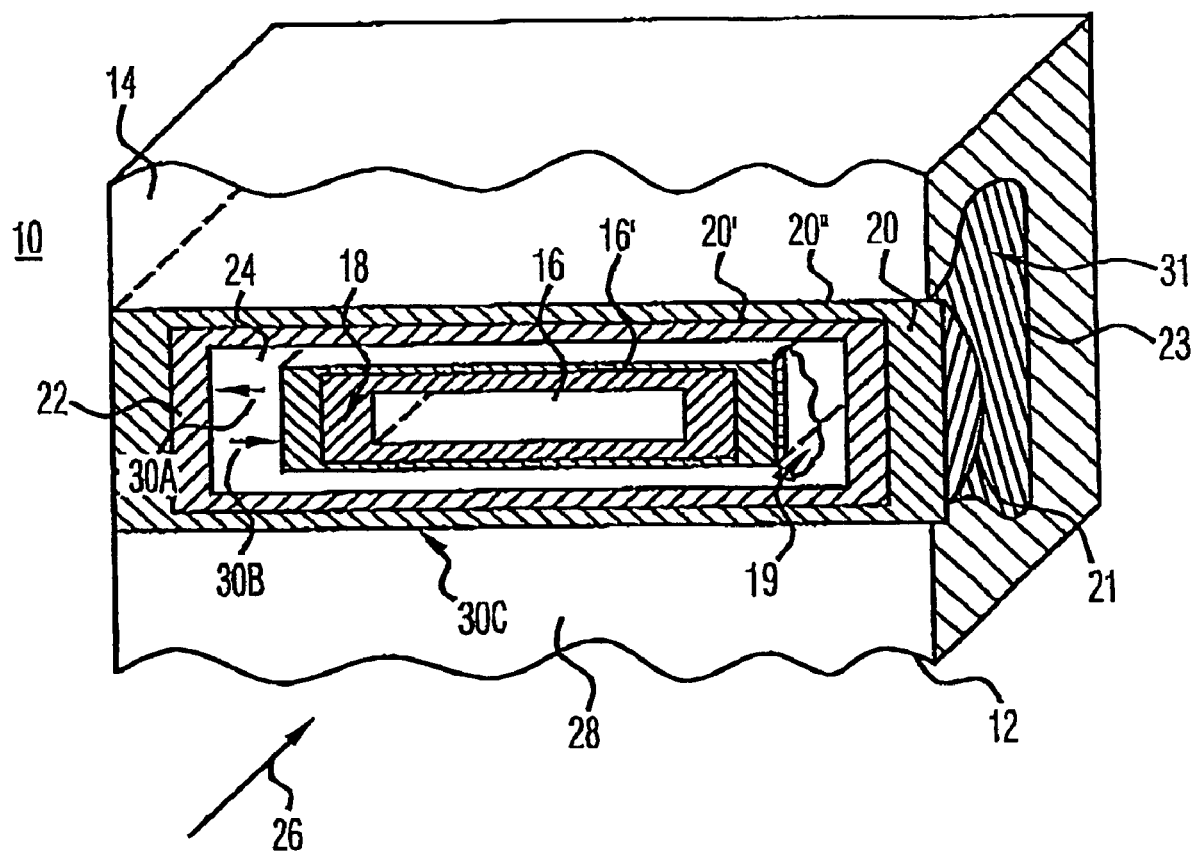
FIG. 1 is a schematic illustration of a photodiode according to an embodiment of the present invention.

FIG. 1 shows an embodiment of a photodiode generally indicated by 10. The photodiode includes a substrate of a first conductivity type, such as, for example, p-doped, which is generally indicated by 12 and comprises a main surface 14 which in FIG. 1, which is designed as a partial sectional spatial illustration, can be seen head-on. In the semiconductor substrate 12, a signal region 16 of a second conductivity type opposite to the first one is formed, such as, for example, n-doped, wherein the perimeter thereof is indicated in FIG. 1 by 16'. The signal region 16 abuts on the main surface 14 and extends to a certain depth into the substrate. A space-charge zone region 18 which in FIG. 1 is illustrated in a hatched manner and extends along the perimeter 16' of the signal region 16 both into the signal region 16 and from there into the semiconductor substrate 12 is formed by the signal region 16 of the second conductivity type in the semiconductor substrate 12 of the first conductivity type. In the depth direction, the space-charge zone 18 also extends to a certain depth, as is shown by the hatched portion in the removed portion at 19. In particular, the space-charge zone region 18 extends away from the main surface 14 deeper into the substrate 12 along the interface or perimeter 16' of the signal region 16 comprising a predetermined depth and, for example, formed as an $n^+$-doped well.

In insulation region 20 is further formed in the semiconductor substrate 12 in a manner surrounding the signal region 16, the region 20 also being of the second conductivity type, such as, for example, lightly n-doped or $n^-$-doped, the perimeter of which is illustrated in FIG. 1 by continuous lines 20' and 20". The insulation region extends as a trench to a depth, which will be discussed later, into the substrate 12, as can be seen by a hatched region 21 in the side section. A space-charge zone 22 extending over the perimeter or the inner interface of the insulation region into both the semiconductor substrate 12 and the insulation region 20 is formed by the insulation region 20 in the semiconductor substrate 12. As is illustrated by the region 23 shown in lines in the side view, the space-charge zone 22 extends from the main surface 14 also in the depth direction into the semiconductor substrate 12 along the inner interface 20' of the insulation region 20.

A diffusion region, having the reference numeral 24, extending between the space-charge zones 18 and 22 is also indicated between the space-charge zones 18 and 22 in FIG. 1. An arrow indicated in FIG. 1 by a reference numeral 26 is to illustrate a radiation direction of incident light. The reference numeral 28 indicates a lateral surrounding region of the semiconductor substrate 12 outside the insulation region 20 and surrounding it. Arrows provided with the reference numerals 30a, 30b and 30c are to illustrate diffusing charge carriers having been generated by the incident light 26. Incident light 26 is detected at the photodiode 10 by detecting the photocurrent via a contacting conductor (not shown) connected to the signal region 16. The photocurrent of the photodiode 10 is composed of a drift current portion and a diffusion current portion. The drift current portion is formed by charge carriers generated in the space-charge zone 18 of the conductivity junction 16' and directly detected due to the cut-off voltage applied to the signal region 16 and the semiconductor substrate 12. The drift current portion generated in this way has a bandwidth in the gigahertz region.

The diffusion current portion is formed by the charge carriers not generated in the space-charge zone 18 and subsequently diffusing to the signal-detecting space-charge zone 18 through the semiconductor substrate 12 without an electromotive force. Due to the insulation region 20 and the space-charge zone 22, respectively, not all the charge carriers generated will reach the signal-detecting diode. This is the reason why not all the charge carriers 30a to 30c generated contribute to the diffusion current of the photodiode 10. The reason for this is that the space-charge zone 20 laterally divides the region in which charge carriers are generated into two parts, namely one part in which the charge carriers generated can reach the signal-detecting diode, and one part where this is not possible. The first part in which charge carriers contributing to the diffusion current portion can be generated, is localized by the space-charge zone 22 and the insulation region 20, respectively, to the diffusion region 24. In contrast, a charge carrier 30c generated in the surrounding region 28 cannot reach the signal-detecting space-charge zone 18 due to the insulation region 20, because it will be captured before by the space-charge zone 20 shielding it. The actual diffusion region or catchment region in which charge carriers can be generated and can diffuse to the signal-detecting space-charge zone 18, would consequently, without the insulation region 20, extend further laterally than the space-charge zone 20 into the surrounding region 28 of the semiconductor substrate 12, namely as far as is determined by the diffusion length of the charge carriers in the semiconductor substrate 12, i.e. the length a charge carrier travels on average or maximally in the material of the semiconductor substrate 12, such as, for example, silicon, before recombining.

Another effect of the space-charge zone 20 is that it does not only limit the effective catchment region of diffusing charge carriers laterally to the diffusion region 24 but that it also intercepts charge carriers 30a, which diffuse to the space-charge zone 20 and not the space-charge zone 18 without an electro-motive drive, generated in the diffusion region 24 and diffusing therein.

Only the remaining charge carriers generated in the diffusion region 24 or in regions of the semiconductor substrate 12 below the signal-detecting space-charge zone 22 by the incident light 26 and diffusing in the space-charge zone 18 before recombining, contribute to the diffusion current portion and thus the photocurrent of the photodiode 10, such as, for example, the charge carrier 30b. Since the diffusion current portion has a smaller bandwidth than the drift current portion in the region of less than 10 MHz, an increase in the read-out speed and the bandwidth of the photodiode 10, respectively, are achieved by decreasing the diffusion current portion by providing the insulating space-charge zone 20.

A vertical shielding of the signal-detecting space-charge zone from deeper regions, arranged below it, of the semiconductor substrate 12 in the depth direction or vertically can be achieved despite the only lateral structural orientation of the insulation region, for example by a doping profile of the semiconductor substrate 12 comprising a doping density decreasing in the depth direction with a predetermined doping gradient, since the result here is a bulging of the space-charge zone 22 in deeper regions of the semiconductor substrate, as is indicated by 31, also extending below the signal-detecting space-charge zone 18 and by this insulating it vertically from even deeper regions of the semiconductor substrate or shielding it from charge carriers generated there and diffusing in the direction of the signal-detecting space-charge zone 18. This effect will be described in greater detail referring to FIGS. 3b and 4. The vertical shielding is supported by providing the insulation region 20 with a lighter doping than in the signal region 16 so that the extension of the space-charge zone 22 is larger than that of the space-charge zone 18.

It is pointed out referring to FIG. 1 that the realization of the photodiode 10 is easily possible in standard CMOS processes.

Different variations of the layout shown in FIG. 1 are possible. It is, for example, not necessary for the insulating space-charge zone 20 to completely laterally surround the signal-detecting space-charge zone 18. On the other hand, with process modifications, the space-charge zone region 22 insulating the detecting space-charge zone 18 or the insulation region 20 could be formed as a semi-shell around the signal-detecting space-charge region 18 even below the signal region 16 in order to additionally shield the signal-detecting space-charge zone 18 from charge carriers generated in deeper regions in the semiconductor substrate 12 in a vertical direction. As has already been mentioned, achieving a vertical shielding of the signal-detecting space-charge zone by a well-form production of both the signal region 16 and the insulation region 20 in the semiconductor substrate 12 using the bulging of the shielding insulation space-charge zone will be described in an embodiment described referring to FIGS. 3a–11. The depth of the insulation well 20 should be larger than the depth of the signal well 16, such as, for example, by a factor from 2 to 20. The lateral spacing between the insulation region 20 forming the shielding space-charge zone 20 and the signal region 16 forming the signal-detecting space-charge zone 18 should be as small as possible and can, for example, in a lateral direction, be less than the diffusion length of charge carriers in the material of the semiconductors substrate 12, i.e. the average diffusion length of charge carriers they move on average at ambient temperature before recombining. Preferable spacings of the insulation region 20 from the signal region 16 include 1 μm to 7 μm. The extensions of the signal-detecting space-charge zones 22 should be as large as possible to set the drift current portion to the biggest portion possible, while the space-charge zones 18 and 22 should have the closest possible position with regard to one another, such as, for example, a spacing of less than 1.5 μm around the signal-detecting space-charge zone 18 or at least over more than half the surrounding region.

Figure 8:
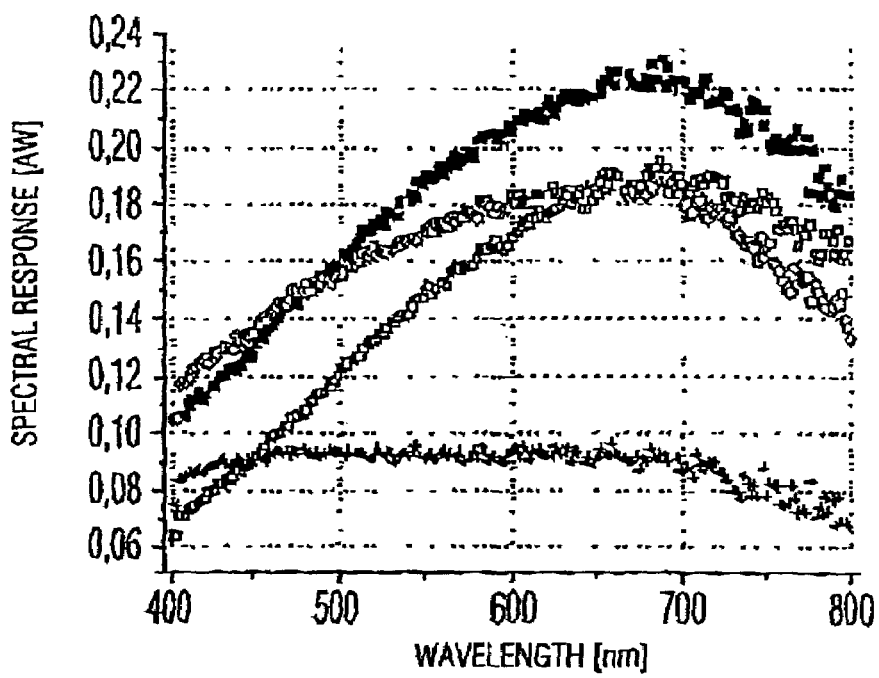
FIG. 8 shows a graph illustrating the spectral response of the diodes of the diode arrangement according to FIG. 3a and generally the spectral response of the diodes formed by the space-charge zones in FIG. 1.

An increase in the shielding effect described herein before referring to FIG. 1 and of the decrease of the diffusion current portion is achieved by not keeping the insulation region 20 in a floating state, i.e. without current, as was assumed in the above, description of FIG. 1, but by operating the diode formed by this region in the semiconductor substrate 12 in reverse direction and using it for reading-out a photocurrent generated in the space-charge zone 20. In order to be able to differentiate between the two diodes, the first diode formed from the space-charge zone 18 is referred to as a quick read-out RF diode and the other diode formed from the space-charge zone 20 is referred to as an LF-diode. In the case of a simultaneous read-out, a contacting conductor is connected to the insulation region for reading-out the photocurrent generated in the space-charge zone region 22 formed by the insulation region 20 and another contacting conductor is connected to the signal region 16 for reading-out the photocurrent generated in the space-charge zone region 18. The positive impact of the simultaneous read-out of the RF and the shielding LF diode is illustrated in FIG. 8 showing a graph in which the sensitivity in amperes per Watt over the wavelength in nanometers is given for the case of an RF photodiode having a comb-like structured $n^+$-well signal region having eight surrounding arms of four cross-shaped structured RE diode $n^-$ well insulation regions for the four different cases so that the read-out is performed at one of the diodes, while the respective other diode is left floating or read-out. In particular, small circles indicate the sensitivity behaviour when reading-out the RF diode at a floating insulation region, small solid squares show the sensitivity behaviour when reading-out the LF diode at a floating signal region 16, small non-solid squares show the sensitivity behaviour when reading-out the LF diode with simultaneously reading-out the RF diode and small crosses indicate the sensitivity behaviour before reading-out the RF diode when simultaneously reading-out the LF diode. As can be seen, the sensitivity or the spectral response of the shielded RF photodiode and of the photodiode formed by the space-charge zone 18, respectively is very variable in the case without a simultaneous read-out (small circles) compared to the case of a simultaneous read-out (small crosses), as regards the wavelength, and indicates the signal waveform described in the introduction to the description. The sensitivity of the read-out of the shielded photodiode, with a simultaneous read-out of the insulation region, however, is relatively constant over the wavelength. The reason for this is that the drift current portion contributing stronger to the photocurrent in this case, is in a first approximation constant over the wavelength with a constant light power.

Figure 2A:
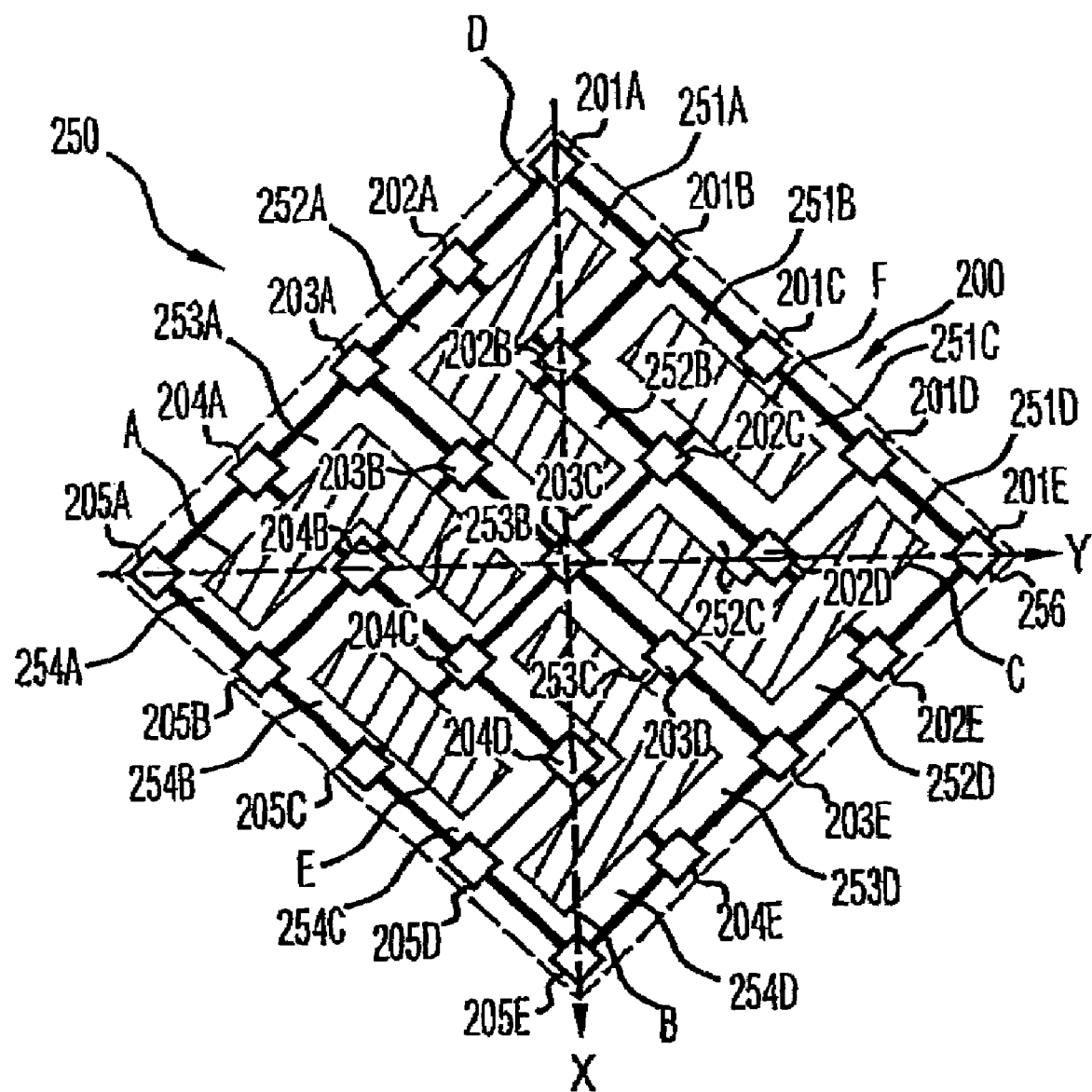
FIG. 2a is a schematic illustration of a detection diode arrangement of an optical scanner according to an embodiment of the present invention.
Figure 2B:
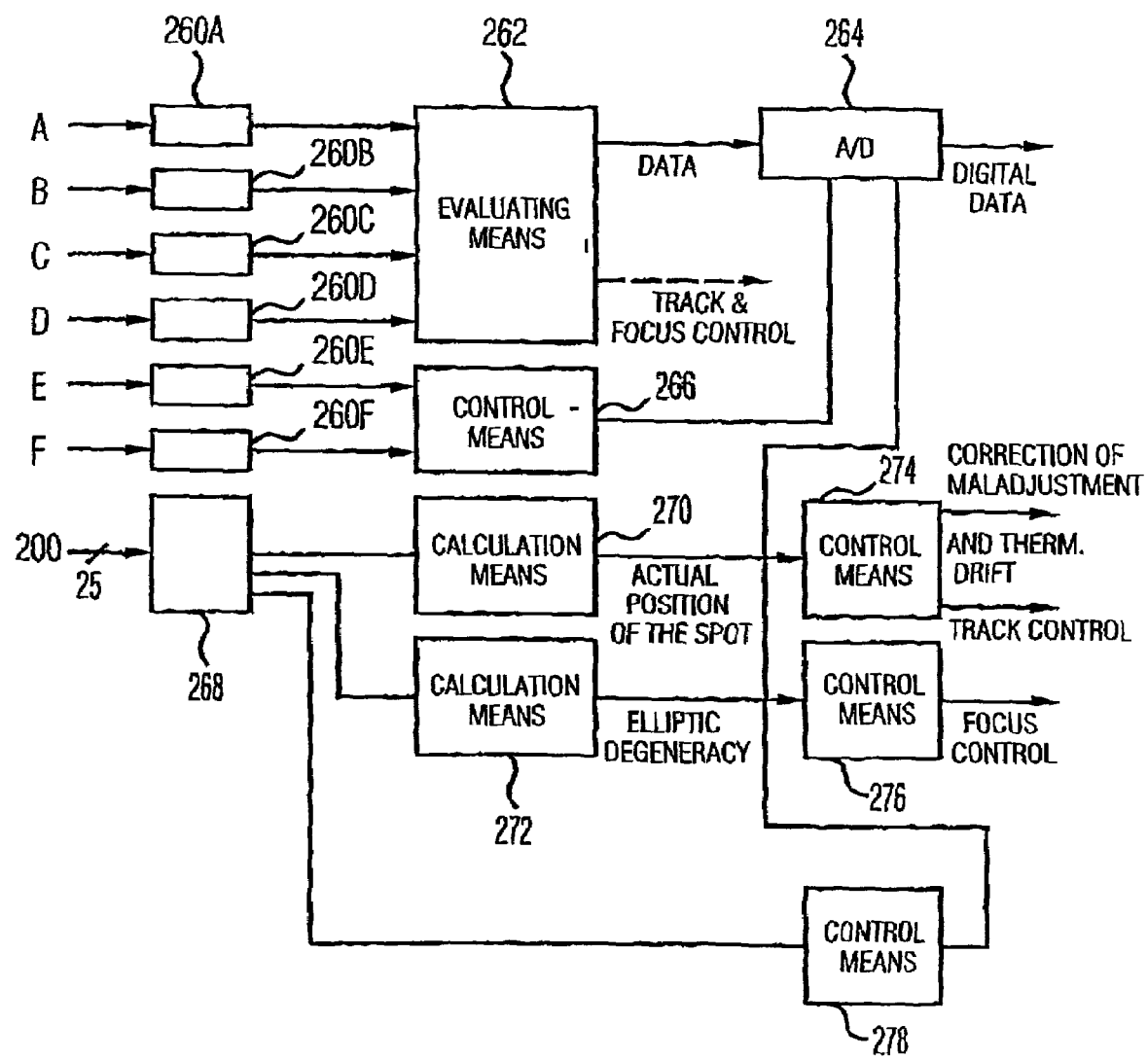
Figure 9:
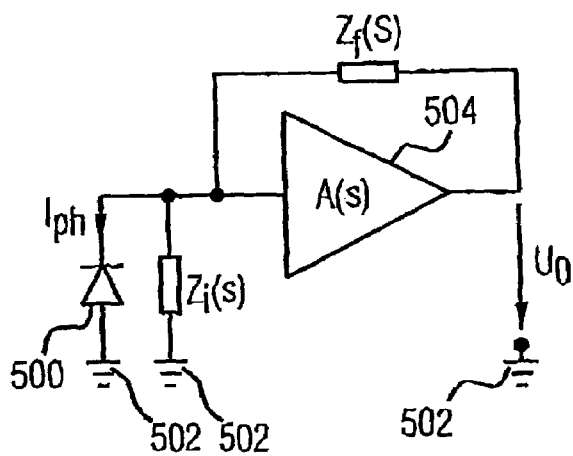
FIG. 9 shows a read-out circuit for reading out the RF diodes of the embodiment of FIG. 2.
Figure 10:
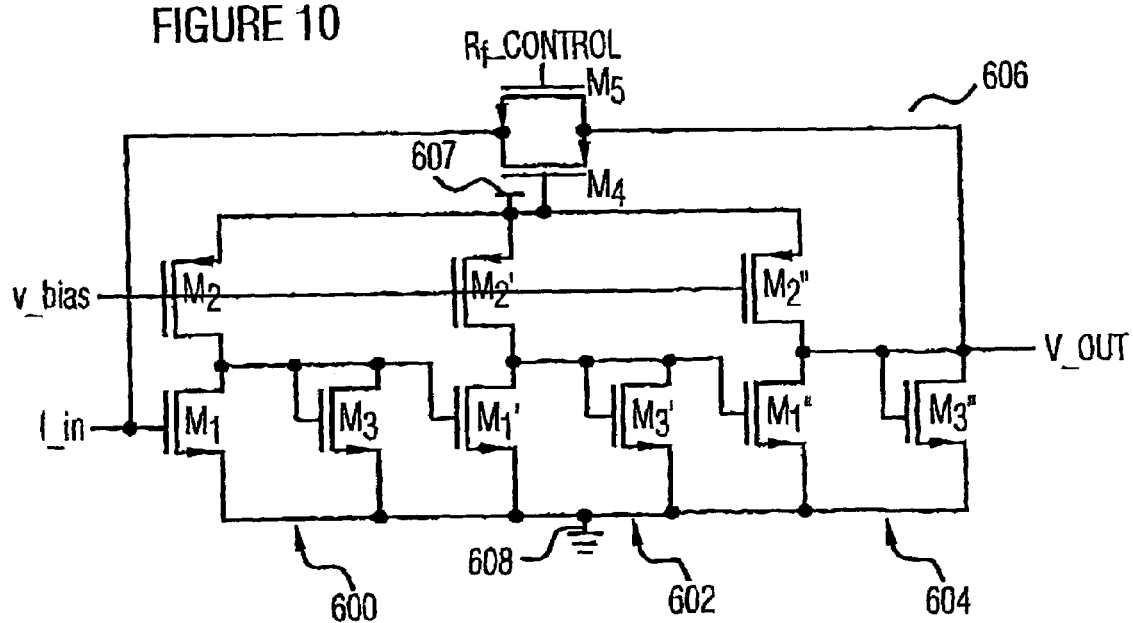
FIG. 10 shows an embodiment of an amplifier circuit for the amplifier of FIG. 9.

A special embodiment of an optical scanner will be described subsequently referring to FIGS. 2a–11, this scanner being suitable for being implemented in conventional CD and DVD apparatuses and thus allowing various measures as regards focus and track regulation and further allowing measures preventing a misalignment of the light beam to be detected from the detection window of the optical detecting device. Although the diode arrangement of the optical scanner, which will be described subsequently referring to FIG. 2a is also suitable for other applications, it will be described subsequently, for a better understanding, only in the context of installing it into the optical scanner with respect to an application in CD apparatuses. While FIG. 2a schematically illustrates the diode arrangement, FIG. 2b shows the read-out and regulation part of the optical scanner. FIGS. 3a, 3b and 4 to 8 show an embodiment for a realization of the diode arrangement in CMOS technology and its features, wherein FIGS. 9 to 11 show embodiments for possible evaluation circuits for reading-out the diodes of the diode arrangement. In the description of FIGS. 2a–11b, fast photodiodes are surrounded by $n^-$ wells which act as insulation regions for the space-charge zones of the fast diodes and as slow diodes to be read-out at the same time. In particular, further preferable designs of possible structures for the insulation and the signal regions are described here. In this special embodiment, the insulation regions are additionally not only used for decreasing the diffusion current portion but also for separating or isolating two neighbouring fast photodiodes.

The optical scanner described subsequently referring to FIGS. 2–11 is installed in a CD drive which is not shown and the set-up of which is basically well-known. The optical scanner described herein after only represents the detection and the read-out and control signal generating part of the CD drive. Furthermore, the CD drive includes a drive for rotating a CD placed into the drive as an optical disc, a laser diode as light generating means generating a light beam, optics and actuators as servo means for adjusting a spacing of the carrier to the track and a lateral position of the carrier relative to the track, depending on control signals for controlling track and focus, as they are, as will be described subsequently, determined from the intensity distribution of the light beam detected by the diode arrangement. The optics include optical devices, such as, for example, a collimator for collimating the laser beam, a polarization-depending transparent or deflecting beam splitter, a polarization direction-changing 45° wafer, an objective or collecting lens for bundling the collimated laser beam to the track of the CD to be read-out on which the data to be read-out is stored and an astigmatic lens for mapping the light beam reflected by the track and collected by the objective lens to the diode array. The diode arrangement, the laser diode and the optics are commonly arranged on the read head and consequently have a fixed position to one another which is designed such that the light beam modulated and reflected by the track is passed via the optics to the diode arrangement such that in an optimal operation, the light beam is arranged, such as, for example, centred, on the diode array of FIG. 2 at a set position. Several disadvantageous circumstances may be responsible for the actual position of the reflected laser beam on the diode array of FIG. 2a to deviate from the set position, such as, for example, by a maladjustment, thermal drift, a lateral or beam-direction misalignment of the read head, wherein this deviation is counteracted by the read-out and control part of FIG. 2b by generating suitable control signals for the servo means from the intensity detected by the diode arrangement of FIG. 2a, as will be discussed herein after.

FIG. 2a schematically shows the diode arrangement of the optical scanner provided for detecting an intensity distribution of a light beam in a detection window and for detecting data transmitted by the light beam and thus representing the detecting part of the optical scanner. In particular, the diode arrangement of FIG. 2a includes a 5×5 array 200 of detecting diodes 201a–201e, 202a–202e, 203a–203e, 204a–204e and 205a–205e, the last number indicating a row number and the letter indicating a column number of the 5×5 array. Furthermore, the diode arrangement of FIG. 2a includes a 4×4 array 250 of detecting diodes 251a–251d, 252a–252d, 253a–253d, 254a–254d. The two arrays 200 and 250 are arranged to each other such that the detecting diodes 251a–254d are in the respective gaps between the detecting diodes 201a–205e. Put differently, the detection diodes 251a–254d are arranged in an area-centred way to the detecting diodes 201a–205e and together form a two-dimensional cubic space-centred arrangement. All the detection diodes 201a–205e and 251a–254d are arranged together in the same detecting window 256 provided for detecting the light beam which is reflected back from the track to be read-out and modulated by the pits of the tracks so that it includes the data to be read-out. The 25 detection diodes 201a–205e are each and individually connected to a read-out circuit 268 (FIG. 2b) reading them out serially to output the output signals thereof in a multiplexed form. The detection diodes 251a–254d of the diode array 250 are connected to one another to form six regions A, B, C, D, and E or connected to one another in parallel and connected to different read-out circuits 260a, 260b, 260c, 260d, 260e and 260f (FIG. 2b) comprising a higher read-out speed than the read-out speed used for reading out the detecting diodes 201a–205e of the 5×5 array 200. In particular, as is indicated in FIG. 2, the detection diodes 254a, 253a and 253b are combined to form the region A, the detection diodes 254d, 253*d* and 253*c* are combined to form the region B, the detection diodes 252*d*, 251*d* and 252*c* are combined to form the region C, the detection diodes 251*a*, 252*a* and 252*b* to form the region D, the detection diodes 254*b* and 254*c* to form the region E and the detection diodes 251*b* and 251*c* to form the region F.

The detection diodes 201*a*–205*e* having a smaller read-out speed are referred to as LF diodes, while the detection diodes 251*a*–254*d* having a higher read-out speed are referred to as RF diodes. The LF diodes 201*a*–205*e* read-out serially are used for generating control signals for the focus and track control and for controlling actuators of the CD apparatus (not shown) into which the optical scanner with the diode array of FIG. 2*a* is installed. The RF diodes 251*a*–254*d* serve for detecting the data transmitted by the light beam incident on the diode arrangement FIG. 2*a*. The subdivision into the regions A–F offers, as will be described subsequently, the possibility that the diode arrangement shown in FIG. 2*a* can provide signals A–D as are also used in conventional CD apparatuses for regulating track and focus, which, for a focus and servo signal generation, are designed based on a diode arrangement according to FIG. 12. The regions E and F are arranged such that they can be employed for detecting cross-talk phenomena, as will be discussed herein after.

After having described before the setup of the diode arrangement of FIG. 2*a*, the part of the optical scanner responsible for reading out the diodes and for generating the servo signal will be described subsequently. The currents generated in the regions A to F are read out or amplified, as has been mentioned above, by respective read-out circuits 260*a*, 260*b*, 260*c*, 260*d*, 260*e* and 260*f*, wherein they are, for example, designed as transimpedance amplifiers, an embodiment of which will be discussed in greater detail referring to FIGS. 9 and 10. The outputs of the read-out circuits 260*a* to 260*d* are connected to an evaluating circuit 262 which, at an output, outputs a data signal to an A/D converter 264 at the output of which in turn the data transmitted by the light beam is output in a digital form. The evaluating circuit 262 can also be designed to use the input signals of the RF diode regions A, B, C and D to generate control signals for controlling track and focus and to output them at one or several more outputs, as is illustrated by the broken line. The evaluation means 262 can, for example, be switched to a corresponding mode where it can be used, together with the diode array of FIG. 2*a*, as a conventional optics detecting means. The outputs of the read-out circuits 260*e* and 260*f* are connected to control means 266 which outputs, at an output, a crosstalk detect signal to a control input of the A/D converter 264.

The current output signals of the detecting diodes 201*a* to 205*e* of the diode array 200 are, as has been mentioned above, fed to a read-out circuit 268 outputting them serially to two calculating means 270 and 272, wherein an embodiment for the setup of the read-out circuit 268 will be discussed in greater detail referring to FIG. 11*a*. The calculating means 270 calculates the actual precision of the spot on the diode arrangement of FIG. 2. The calculating means 272 calculates the elliptical degeneracy, i.e. the extent and the direction, of the spot on the diode arrangement of FIG. 2. The information of the calculating means 270 calculated is fed to control means 274 which, depending thereon, outputs control signals for correcting maladjustment and thermal drift and for controlling the track, to suitable actuators changing the position of the read head across the track and the lateral position of the diode arrangement of FIG. 2*a*, as will be detailed subsequently. The information of the calculating means 272 is output to control means 276 which, depending thereon, generates control signals for a focus control for a corresponding actuator in order to change the spacing to the optical disc. Control means 278 directly receives the read-out signal of the read-out circuit 268 and determines a control signal for compensating disc tilts and substrate thickness variations therefrom, as will be detailed subsequently, in order to output same to another control input of the A/D converter.

The mode of functioning of the optical scanner having the diode arrangement of FIG. 2*a* and the read-out and control part of FIG. 2*b* and the advantageous application and mode of operation thereof will be described hereinafter in the light of the CD drive into which it is installed.

For a data read-out, the signals of the RF diodes of the regions A, B, C and D are combined by the evaluating means 262, i.e. their output signals are added. The A/D converter digitalizes the combined output signal of the regions A to D based on a threshold value which it obtains from the crosstalk detect signal from the control means 266, and outputs the digitalized data as data to be read out and stored in the track to be read out. As has been mentioned in the introduction to the description, it is also possible to connect the output signals of the regions A to D with one another to generate control signals for focus and track control. Using an astigmatic lens for mapping the reflected light beam transmitting light to the diode arrangement of FIG. 2*a*, the evaluating means 262 is able to generate signals for regulating spacing and focus by adding the output signals of the regions A, B, C and D of the read-out circuits 260*a*–*d* and subtracting the sums from each another, i.e. (A+C)−(B+D), in order to detect the elliptical deformation when defocusing, wherein it is assumed that the main axes of the astigmatic lens extend along the axes x and y indicated in FIG. 2*a*. An actuator then shifts the spacing of the objective lens to the optical disc corresponding to the focus regulation signal. Furthermore, the evaluation circuit 262 is able to generate signals for regulating the track, i.e. for controlling the radial movement of the read head over the rotating optical disc, by evaluating the signal (A+D)−(C+B) which is characteristic of the so-called push-pull pattern caused by an interference of refraction orders which are generated by the elevations having the effect of a phase grating.

Apart from the signals of the regions A, B, C and D generated by means of the diode array illustrated in FIG. 12, regions E and F provide further signals. In the present case, these regions are arranged such that they are at positions where crosstalk phenomena may occur due to the simultaneous read-out of two tracks, i.e. due to the fact that the read-out spot focused on the optical disc illuminates both the actual track to be read out and a neighboring track with its outer edges. In a conventional diode arrangement, such a crosstalk phenomenon would result in a bit error when calculating A+B+C+D for retrieving data, if there was another binary value (pit or non-pit) on the neighboring track than on the actual track. By providing the two additional regions E and F, such a stimulation by a crosstalk phenomenon can be detected. For this, the control means 266 receives the read-but signals from the read-out circuits 260*e* and 360*f* and determines whether the output signal of one of the two regions E and F exceeds a threshold value. Should this be the case, the control means 266 will set the decision threshold for digitalizing the signal A+B+C+D by the A/D converter 264 to a corresponding higher value by the crosstalk detect signal to prevent a bit error since the crosstalk phenomenon, in the sum signal, may result in an erroneous, too high intensity value.

While previously the combination of the RF diodes 251a–254d to regions A–F as well as the use of these combined signals in the read-out of a track of a CD has been described, in the following the use of the output signals of the LF diodes 201a–205e is described, wherein it is again assumed that the spot focused on the track of the CD is imaged to the diode arrangement of FIG. 2 by an astigmatic lens with the main axes X and Y, so that a too small spacing to the CD of the objective lens of the optics focusing the laser beam from the laser diode onto the CD and imaging the reflected light beam together with the astigmatic lens onto the diode arrangement of FIG. 2 for example leads to an elliptic degeneracy along the axis y and too large a distance to an elliptic degeneracy along the axis X.

The utilization of the intensity distribution of the light beam detected by the LF diodes 201a and 205e takes place by the calculation means 270, 272 and the control means 274, 276. The calculation means 270 calculates a location of the intensity centroid or an actual position of the light beam on the diode arrangement of FIG. 2a from the read-out signal of the read-out circuit 268 illustrating the intensity distribution of the detected light beam at the LF diode array and outputs this information to the control means 274, whereas the calculation means 272 determines a shape or an elliptic degeneracy of the laser spot from the same information and outputs it to the control means 276. The determinations by the calculation means 270 and 272 may for example be ascertained by means of interpolation or fits or fitting function determination via the intensity values of the LF diodes and ensuing evaluation, such as extremes search in the case of the actual position determination and analysis of the expansion of a line of equal intensity in the case of the degeneracy determination.

By means of the location information of the spot on the diode arrangement of FIG. 2a, the control means 274 generates control or servo signals for the compensation of maladjustments within the read head, i.e. between laser diode, optics, and/or diode arrangement, as well as thermal drifts therebetween, and control or servo signals for the track control. The control means 274 controls, for example depending on a deviation of the actual position of the laser spot on the diode arrangement of FIG. 2a calculated by the means 270 from a target position, which presently lies in the intersection of the two axes X and Y, suitable actuators, such as piezo elements, to laterally displace the diode arrangement correspondingly, or other actuators adjusting the relative position of the read head transversal to the track to be read out. The possibility of the lateral adjustment of the diode arrangement loosens the requirements to the fabrication process of a read head in which the optical detection device as well as the accompanying objects and the laser diode are built in, and thus causes cost savings in the manufacture of the read head or the CD device. It is to be pointed out here that the matrix of LF diodes 200 to this end could also be extended across the region of the RF diode matrix 250 so that a larger region for electronic adjustment would develop.

Just like maladjustments and thermal drifts, as just mentioned, misalignments of the read head transversal to the track to be read out also lead to a displacement of the actual position of the spot generated by the light beam to be detected on the diode arrangement of FIG. 2a. With the LF diode array 200 of FIG. 2a or the actual position of the spot detectable thereby, however, monitoring of the course of this actual position is possible in a quantitatively sufficiently accurate manner, in order to again enable look-ahead control or servo signal generation for the track correction. The control means 276 could for example control the actuator responsible for the radial offset of the read head or the displacement in direction transversal to the track the more strongly, the more the actual position of the spot deviates from the target position, and, looking ahead, even more strongly, the quicker the increase of the deviation is.

Disk tiltings of the optical disk from a target plane and substrate thickness variations on the storage medium or the optical disk lead to different reflectivities. The mean value of the light intensities detected by the LF diodes 201a–205e is therefore used by the control means 278 for taking these different reflectivity conditions into account in the data recovery by adjusting the decision threshold for the digitalization of the signal A+B+C+D in the digitalization by the A/D inverter lower in the case of decreased reflectivity and otherwise higher. This also loosens the requirements for the fabrication process of the CD device as well as in the production of the optical disks themselves and thus results in cost savings.

As mentioned, focus errors lead to an elliptic degeneracy of the laser spot on the detection diode arrangement of FIG. 2. The elliptic degeneracy is detectable by means of the LF diodes 201a–205e and is determined by the determination means 272, so that the control means 276 can adjust a control signal for the focus control or a control signal to an actuator for the alteration of the spacing of an objective lens from the CD depending on the detected elliptic degeneracy or the alignment thereof or the extent thereof.

Figure 3A:
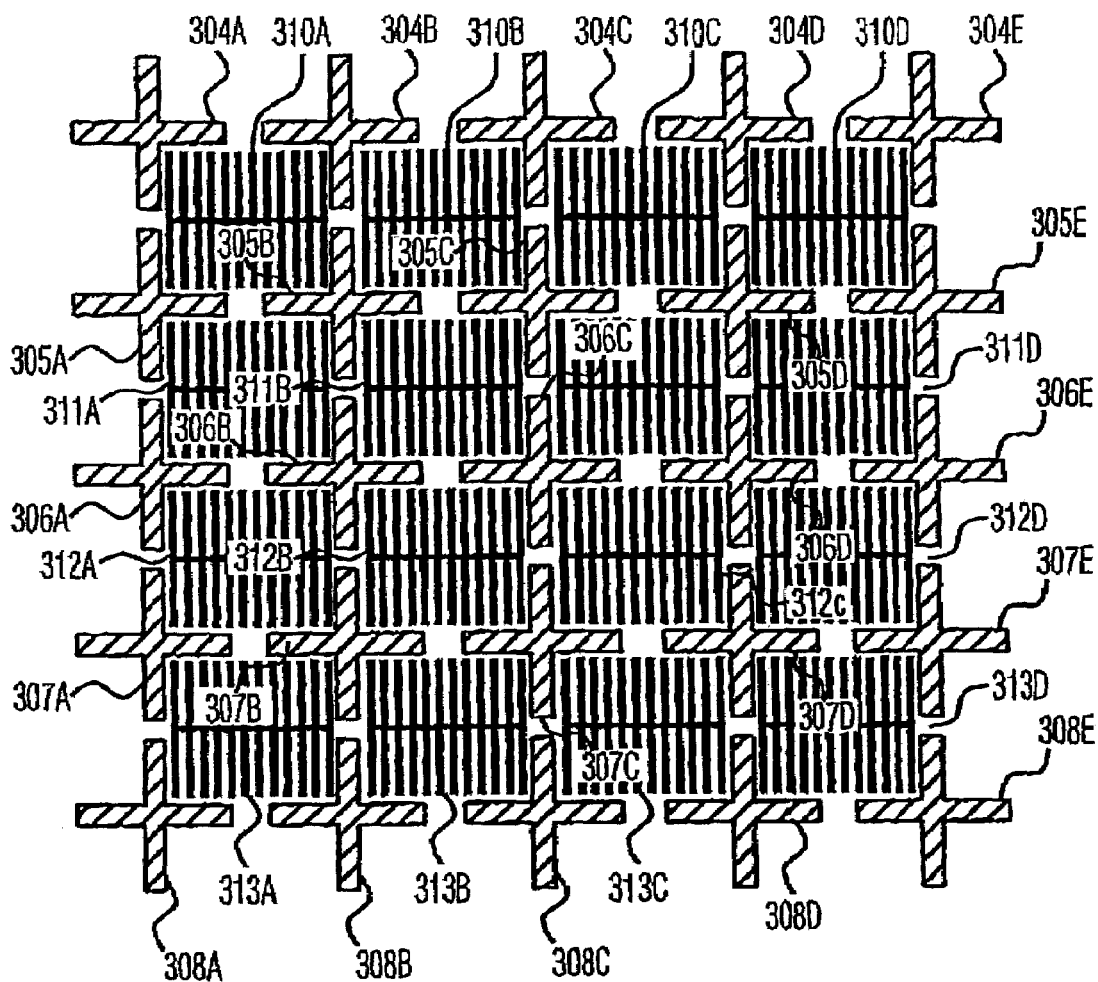
FIG. 3a shows an exemplary layout for the diode arrangement of FIG. 2 according to a special embodiment of the present invention.
Figure 3B:
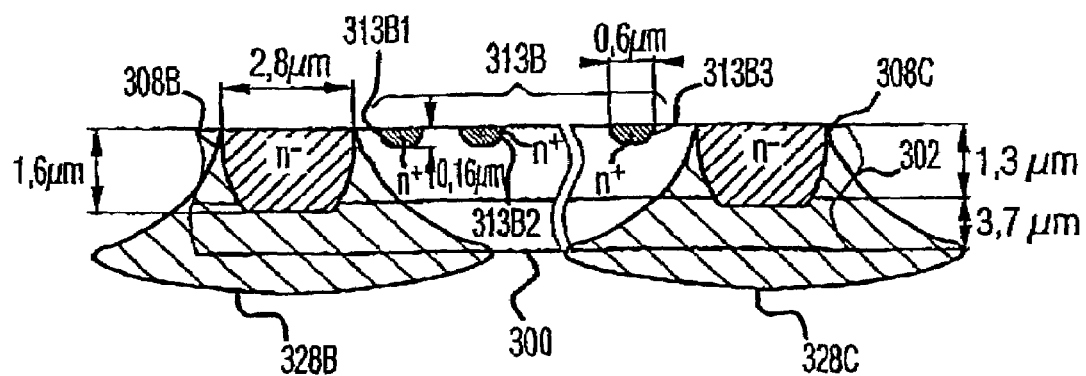

Referring to the following figures, an advantageous realization of a diode arrangement of FIG. 2a is described, which may be implemented in CMOS technology, such as 0.6 μm standard CMOS technology, and in which the inventive shielding of quick RF diodes is caused by space charge zones formed from insulation regions with simultaneous read-out thereof. At first, with reference to FIGS. 3a and 3b, the layout of the diode arrangement is described. FIG. 3a shows a plan view of the diode arrangement, whereas FIG. 3b illustrates a sectional image along the sectional plane indicated in FIG. 3a by the dashed line. The entire diode arrangement is formed on an epitactic p⁻ doped silicon (Si) substrate 300. A p⁻ well 302 extends across the entire region occupied by the diode arrangement and is not illustrated in FIG. 3a. The LF diodes have been produced by means of n⁻ wells structured in the shape of a cross in the p⁻ well and are provided with the reference numeral 304a–308e.

The n⁻ wells 304a–308e extend along the cross-section, as can be seen in FIG. 3b, all the way down into the epitactic p⁻ substrate 300. The RF diodes are formed by double-comb-structured, square n⁺ diffusion regions in the p⁻ well 302 and provided with the reference numeral 310a–313d. In FIG. 3b only the section through the n⁺ diffusion region 313b is shown, wherein in particular only three fingers 313b1, 313b2 and 313b3 of the double-comb structure are shown. The cross-structured n⁻ wells 304a–308e extend, with their four arms, between two adjacent n⁺ diffusion regions 310a–310d each, such that each pair of adjacent n⁺ diffusion regions is substantially separated by two arms of adjacent n⁻ wells extending toward each other and spaced via a gap. The contactings of the n electrodes of the individual LF and RF diodes may be provided by suitable routing of traces. As can be taken from FIG. 3b, exemplary dimensions for the layout are: 1.6 μm depth of the n⁻ wells, 2.8 μm width of the four arms of the n⁻ wells, 0.16 μm depth and 0.6 μm width of the fingers of the n⁺ diffusion regions, 3.7 μm thickness of the epitactic Si substrate 300, and 1.3 μm thickness of the p⁻ well 302. The benefits resulting from the lateral shapes, the cross-sections and the dopings of the LF and PF diodes formed by the n⁻ wells 304a–308e and the n⁺ diffusion regions 310a–313d in the p⁻ well 302, respectively, are explained in greater detail in the following with reference to FIGS. 4 to 8.

An advantage of the comb-like structure of the n⁺ diffusion regions of the RE diodes is that the penetration depth for wavelengths in silicon in the near-ultraviolet region, i.e. 405 nm, which will be relevant for future generations of storage systems, is about 200 nm, so that the electron hole pairs are mainly generated at the surface. This means that the electron hole pairs are separated more effectively by lateral pn junctions, i.e. those portions of the pn junctions in which the pn interface away from the surface extends substantially perpendicularly to the surface, as they exist along the perimeter of the n⁺ diffusion regions and in n⁻ wells. Since by the comb structure of the n⁺ diffusion regions 310a–313d the ratio of the length of the perimeter to the lateral area of the n⁺ diffusion regions 310a–313d is especially large, this leads to improved sensitivity or response of the n⁺ diffusion regions 310a–313d or the strip-shaped diode fingers 313b1–313b3 in this wavelength region as opposed to more compact structures.

Figure 5:
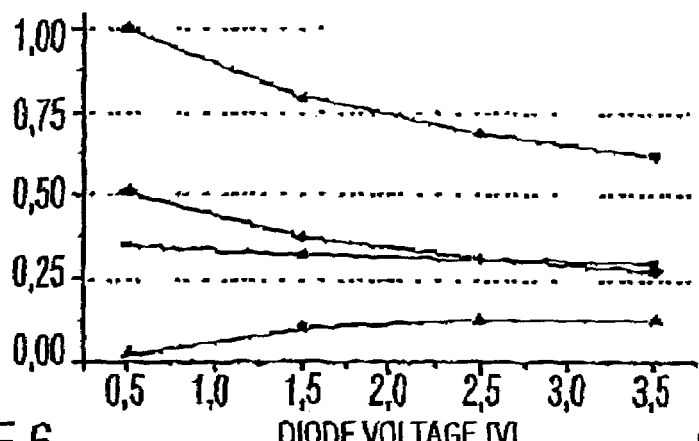
FIG. 5 shows a graph illustrating the area and perimeter capacity of the RF and the LF diode in the diode arrangement of FIG. 3a in dependence on the diode voltage to illustrate the improved distributed capacity of area and edge.

A further advantage of the comb-like structure of the n⁺ diffusion regions 313a–313d is that they have low photodiode capacitance. This is advantageous because they are to enable an as quick as possible read-out, and because this leads to an increased bandwidth in the read-out by means of transimpedance amplifiers, as it will be described with reference to FIGS. 9 and 10 In the case of the use of a transimpedance amplifier with a high bandwidth of for example up to 250 MHz and a high transimpedance of for example up to 200 kΩ for the read-out, the bandwidth $f_{-3db}$ of the read-out system of transimpedance amplifier and diode for example depends on the photodiode capacitance $C_{Diode}$ as follows:

$$f_{-3dB} \propto \frac{A}{2\pi R_f} \cdot \frac{1}{C_{Diode}}$$

wherein $R_f$ represents the transimpedance and A the DC amplification of the transimpedance amplifier and $C_{Diode}$ the photodiode capacitance. For the achievement of high bandwidths, as it is desirable for the RF diodes responsible for the data recovery, it is hence necessary to keep the interface capacitance of the diode to be read out as low as possible, to minimize the requirements imposed on the transimpedance amplifier. FIG. 5 shows that the double-comb structure of the n⁺ diffusion regions 310a–313d of the RF diodes leads to a reduction of the photodiode capacitance. In FIG. 5, the area capacitance of the RF diodes is plotted in units per area unit (indicated with round dots) and the perimeter or sidewall capacitance thereof in units per length unit (indicated with quadrangles) against the diode voltage V across the RF diodes. As can be seen, the comb structure helps the RF diodes have a smaller diode capacitance due to the higher perimeter/area ratio, so that the achievable bandwidth of the read-out system, which will be described in greater detail with reference to FIGS. 9 and 10, is correspondingly higher.

The benefits of the well structure of the LF diodes mainly consist in that this structure leads to a larger vertical (depth) extension of the well as compared to that of the n⁺ diffusion regions. In addition, the lateral shape of the n⁻ wells 304a–308e as crosses provides for the fact that each RF diode is almost completely surrounded by the arms of four adjacent n⁻ wells 304a–308e. Hereby altogether a kind of protective ring for those RF diodes is formed both in lateral and, by the deep cross-section of the n⁻ wells, in vertical direction. Because if charges are generated along the perimeter of a RF diode, these are rather caught by a LF diode 304a–308e than by an adjacent RF diode, which therefore yields a crosstalk separation in lateral direction between the RF diodes. Diffusing charge carriers in the epitaxy layer 200 that were not caught by the RF diode are caught by one of the adjacent LF diodes, so that they cannot diffuse to another adjacent RF diode, which is referred to as a vertical crosstalk separation of the RF diodes for the present application. This leads to an increased resolution of the spatial intensity distribution detected by the RP diodes.

Another advantage of the above-described "sucking-off" of diffused charge carriers by the LF diodes consists in the fact that these diffused charge carriers would smear the pulse shape of the diode response due to their diffusion time and would thus lead to a slower data read-out speed. Since the read-out of the LF diodes, as it will be discussed in greater detail in the following with reference to FIG. 11a and has already been briefly mentioned previously, is executed at low frequencies in the kHz range, the slow diffusion current caught by the LF diodes, however, has no effect on the detection of the intensity distribution of the incident light beam by the LF diodes, which may be used, as described above, for the control of the alignment of the light beam to be detected with the detection window. It is expressly pointed out that the "suction" of diffusing charge carriers by the LF diode wells 304a–308e, as has just been described, leads to a shielding of the signal-detecting space charge zones of the RF diodes 310a–313d both in lateral regard and in vertical regard. The lateral shielding has been previously described in connection with the crosstalk protection effect of the LF diode wells 304a–308e. The vertical shielding occurs due to a bulging of the space charge zones formed by the LF diode wells 304a–308e, which are illustrated in the side sectional illustration of FIG. 3b with 328b and 328c for the diode regions 308b and 308c. The bulging of the space charge zones 328b and 328c increasing with depth results due to a doping profile of the substrate 300, which has a doping density decreasing with a predetermined doping gradient, and may also be seen from the simulation of FIG. 4, which will be described in the following. The large expansion of the space charge zones 328b and 328c is still supported by the weak doping of the LF diode wells as compared to the strongly doped RF diodes and by the about ten times greater depth expansion of the LF diode wells 304a–308e as compared to the RF diode regions 310a–313d.

Forming the LF diodes by n⁻ wells instead of by n⁺ diffusion regions is advantageous in that hereby a smaller capacity value is achieved. For the illustration thereof, in the graph of FIG. 5 also the sidewall photodiode capacitance (indicated with diamonds) and the area photodiode capacitance (indicated with triangles) for the case of n⁻ well diodes, with otherwise equal lateral structure as diode the structures underlying the n⁺ diffusion region diode capacity values shown in FIG. 5, are plotted against the diode voltage V. As can be seen, the capacity of a n⁻ well diode is lower as compared with a n⁺ diffusion diode. Moreover, the cross shape of the n⁻ wells 304a–308e also reduces the diode capacitance due to the higher perimeter/area ratio. The diode capacitance reduction achieved by the choice of the structure of the LF diodes again yields a lower signal/noise ratio in the LF diode read-out. Thus, in the case of integrative read-out of the n⁻ well LF diodes, as will be explained in greater detail in the following with reference to FIG. 11a and in which the LF diodes are read out by integration and the photocurrent is integrated at the intrinsic interface capacitance of the photodiode, the following formula applies for the signal/noise ratio of such a read-out system:

$$S/N \text{ ratio} = 20\log\left(\sqrt{\frac{I_{ph}^2 T_{int}^2}{e^{-(C_{Diode}U_{Th} + I_{ph}T_{int})}}}\right)$$

Here, $T_{int}$ is the integration time and $U_{Th}$ is the threshold voltage of that transistor provided to adjust the LF diode to a defined potential at the beginning of an integration cycle, $I_{ph}$ the photocurrent of the diode, and $C_{Diode}$ the photodiode capacitance. As a result, the signal/noise ratio increases with decreasing diode capacitance, which is an additional advantage of the cross-structured n⁻ wells.

Figure 4:
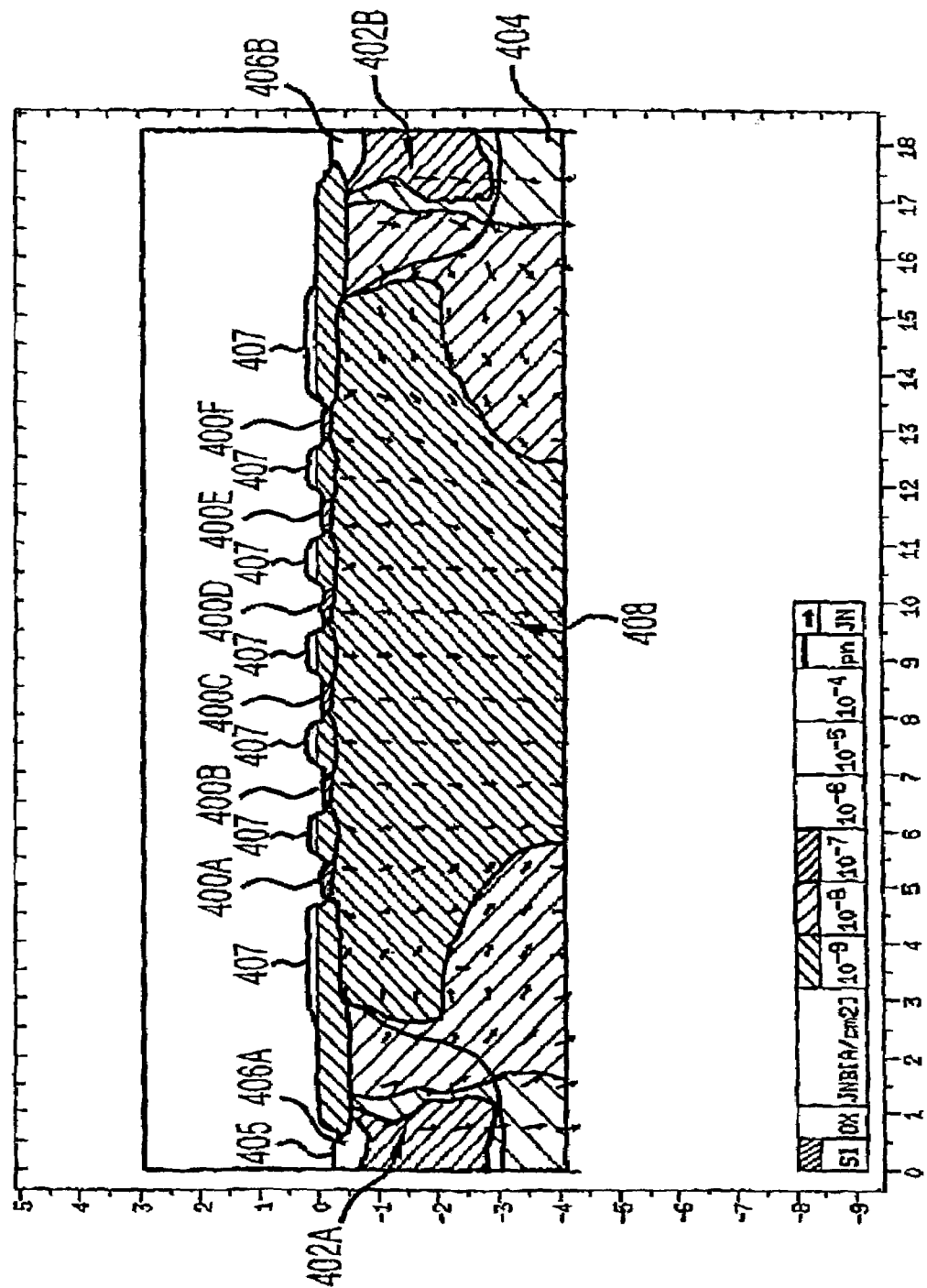

With the aid of a simulation program, a simulation of the current density of thermally generated minority charge carriers as indication for optically caused charge carriers was performed along a sectional plane, which, except for the number of fingers of the double-comb-structured n⁺ diffusion regions, corresponds to the section of FIG. 3b. The result of this simulation is shown in FIG. 4, wherein there the direction and length of the equidistantly arranged arrows indicate the direction and the magnitude of the dark current at the respective location, and wherein the number scales at the left and the bottom side of the image are length indications in micrometers. The magnitude of the dark current is also illustrated by the dashed contour lines or shading. In FIG. 4, several RF diode n⁺ diffusion regions 400a, 400b, 400c, 400d, 400e, and 400f are shown surrounded by two LF diode n⁻ wells 402a and 402b in an epitactic p⁻ substrate 404 not provided with a p⁻ well for simulation purposes. For the contacting of the n⁻ wells 402a, 402b, n⁺ doped well contact regions 406a and 406b are provided at the surface 405. Field oxide is indicated with 407 and is on the surface 405. An arising conductivity junction of the RF diodes is indicated with solid lines between the n⁺ regions 400a–400f. As it can be seen from FIG. 4, the simulation yields that the space charge zone almost completely expands below the RF-diode fingers 400a–400f, which enables the vertical shielding of the latter from diffusing charge carriers generated in lower regions and thus the higher bandwidth of the RF diodes due to the increased drift current portion and decreased diffusion current portion. The arrows representing the dark current, which have been calculated by the simulation at equidistant positions, serve as measure for the course at charge carriers generated by light. As it can be seen, only a small portion of the charge carriers generated deeper than 2 μm reaches the RF diode fingers 400a–400f, so that the photocurrent there at substantially consists of drift current, which represents a speed enhancement as compared with RF diodes not shielded by surrounding LF diodes, because, as previously mentioned, charge carriers generated more deeply create a long time offset between generation and detection due to their long diffusion path. The reason for the low diffusion current is that the RF diodes 402a and 402b remove most minority charge carriers below a depth of 2 μm below the Si/SiO₂ surface. Only the middle part 408 below the RF diodes 400a–400f catches charge carriers having been generated in deeper regions. As it can also be seen, it is effectively inhibited that charge carriers diffuse to adjacent n⁺ RF diode fingers of adjacent RF diodes, so that good cross-talk separation is achieved.

From the above considerations, a further advantage results by the "suction" of the diffusion current by the LF diodes surrounding the RF diodes by their cross structure. Noting that the penetration depth of the light for the wavelength of 405 nm, the wavelength of future optical storage systems, is 0.196 μm, for light of the wavelength of 650 nm, the operational wavelength of DVD devices, is 2.89 μm, and of light of the wavelength with 780 nm, the operational wavelength of CD-ROM devices, is 8.0 μm, it can be seen from the simulation of FIG. 4 that by irradiation with wavelengths of 650 nm and 780 nm the generated charge carriers do not contribute to the photocurrent of the RF diode fingers 400a–400f. As a result, at fixed light power the magnitude of photocurrent of the RF diodes is less sensitive to the respective wavelength of light. As a result, the presence of the LF diodes in the above-described n⁻ well shape has a linearizing effect with reference to the spectral response of the RF diodes. This linearization effect can also be seen from FIG. 8 showing a graph in which a spectral response of the LF diodes (indicated with small squares) and RF diodes (indicated with small crosses) is plotted versus the wavelength. Both curves represent the spectral response of the RF or LF diodes in the case of the simultaneous read-out of these diodes, as is the case during the operation of the optical scanner of FIG. 2a and 2b. As can be seen, the LF diodes exhibit the typical spectral response behaviour of photodiodes: since generally the recombination rate of charge carriers at the surface is higher than in charges generated more deeply, the spectral response or sensitivity of the diodes increases with rising wavelength. From a certain wavelength on, which is about 650 nm in the present case, however, the diffusing charge carriers no longer reach the space charge zone of the LF diodes before recombining due to the fact that the penetration depth of light into the semiconductor substrate increases with the wavelength. Accordingly, a drop of the sensitivity for greater wavelengths takes place from 650 nm onwards. The characteristic curve of the RF diodes, however, basically differs from that of the LF diodes. As can be seen, they only show a slight increase from 0.008 A/W in the region from 400 nm to 460 nm. From 460 nm to 700 nm, the sensitivity of the RF diodes remains nearly constant and only falls 0.21 A/W in the interval from 700 nm to 800 nm. Noting that the amplification of a transimpedance amplifier, used for the read-out of the RF diodes, as already mentioned more often previously and described in greater detail in the following, with active feedback is usually exposed to variations of ±5% due to nonlinearities of the transistors used for its construction, which are partly used in the triode region, the spectral response of the RF diodes may be regarded as almost linear. This results in a read-out system with almost constant amplification for all wavelengths. Due to the rough surface of the finger diode structure of the RF diodes and the resulting varying oxide thickness, an interference phenomenon in the wavelength region of 650 nm to 800 nm does also not occur in the RF diodes, as it is the case in the LF diodes, in which the interference phenomenon at these wavelengths slightly affects the spectral response function. It is also advantageous in the RF diode structure, as can be taken from FIG. 8, that the RF diodes exhibit relatively better sensitivity for wavelengths in the near ultraviolet region, i.e. the wavelengths of future optical storage systems.

Figure 6:
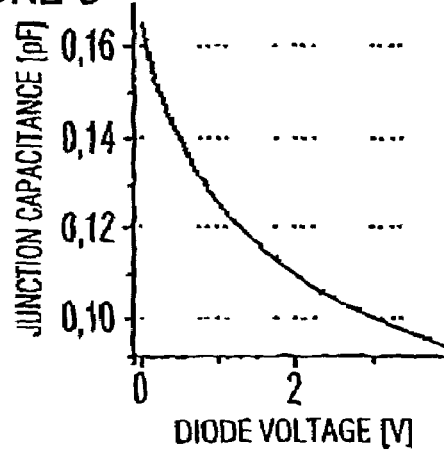
FIG. 6 shows a graph illustrating the junction capacity of an RF diode of the diode arrangement according to FIG. 3a in dependence on the diode voltage.
Figure 7:
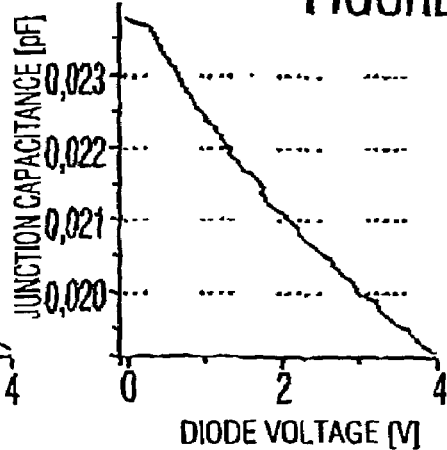
FIG. 7 shows a graph illustrating the junction capacity of an LF diode of the diode arrangement according to FIG. 3a in dependence on the diode voltage.

Only for the sake of completeness, two graphs are shown in FIGS. 6 and 7, which illustrate a capacitance of the individual RF diode (FIG. 6) and LF diode (FIG. 7) plotted versus the diode voltage. As can be seen, the absolute capacitance of the RF diodes ranges from 98 femtofarad at 3.3 V to 165 femtofarad at 0.1 V. This is a range of values that can be read out easily using a transimpedance amplifier for the read-out. The variation of the capacitance is no problem, because the voltage across the diode is held constant by the read-out circuit. The absolute value of the junction capacitance of the LF diodes ranges from 19.7 femtofarad to 22.4 femtofarad in a voltage range from 3.3 V to 1 V, which represents the range in which the integration of the photocurrent is performed in the read-out circuit of FIG. 11a to be described in the following.

After having previously described an embodiment for a hardware realization of the diode arrangement of FIGS. 2a, 2b with reference to FIGS. 3–8, in the following an embodiment for possible read-out circuits of the LF or RF diodes will be described with reference to FIGS. 9–11, with FIGS. 9 and 10 first referring to the read-out of the RF diodes, whereas FIG. 11a deals with the read-out of the LF diodes.

FIG. 9 schematically shows the basic configuration of the read-out of a RF diode or of RF diodes combined or connected in parallel to a RF diode region, wherein the RF diode or RF diode region to be read out is indicated with the reference numeral 500 and generates the photocurrent $I_{ph}$. The RF diode is connected between reference potential 502 and an input of the transimpedance amplifier 504, whose construction will be explained in greater detail at an exemplary embodiment with reference to FIG. 10. The impedance $Z_f(S)$ represents the impedance of the feedback branch of the transimpedance amplifier 504, whereas $Z_i(s)$ represents the source impedance. $U_0$ is the output voltage at the output of the transimpedance amplifier 504. An analysis of the basic configuration of FIG. 9 yields the transfer function of this configuration with $$\frac{U_0}{I_{ph}} = \frac{A(s)Z_f(s)Z_i(s)}{Z_i(s)(A(s)-1)-Z_f(s)}$$

wherein A(s) indicates the amplification of the transimpedance amplifier 504. In the case on an ideal amplifier with infinite amplification, this equation yields $U_0 = Z_f(S) I_{ph}$, which shows that the photocurrent $I_{ph}$ is converted to a voltage with the factor $Z_f(s)$.

In the case that CMOS technology is used for the implementation, $Z_f(S)$ may be regarded as an ohmic resistance $R_f$, whereas $Z_i(s)$ may be regarded as capacitive value consisting of the gate capacitance $C_g$ of, an input transistor of the transimpedance amplifier and the junction or interface capacitance of the RF diode 500 $C_d$. s is a variable for the read-out frequency. Assuming that the transimpedance amplifier 504 has a sufficiently high bandwidth, i.e. A(s)=A, and with the above assumptions or considerations, the latter formula results in $$\frac{U_0}{I_{ph}} = \frac{AR_f}{(A-1)\left(1-\frac{s(C_g+C_d)R_f}{A-1}\right)}$$

From this equation the −3 dB bandwidth results with $$f_{-3dB} = \frac{1-A}{2\pi(C_g+C_d)R_f}$$

The last equation shows that the −3 dB bandwidth of the RF read-out is mainly determined by three parameters: The −3 dB bandwidth rises with the magnitude of the amplification A, wherein A has to be negative for stability reasons. In addition, the −3 dB bandwidth falls with rising feedback resistance or input capacitance. A feedback resistance of 63 kΩ and a voltage amplification value of 30 for example yield a bandwidth of 142 MHz.

FIG. 10 shows an embodiment of the transimpedance amplifier 504, which presently is a single-ended input amplifier having better noise behaviour as compared with a standard operational amplifier as it is used in most optical pick-up units due to the smaller input transistor number. The transimpedance amplifier of FIG. 10 includes three amplification branches 600, 602 and 604 and a feedback path 606. Each of the amplification branches 600–604 is identically constructed except for parameter quantities of the devices, which is why in the following the construction is only described regarding the first amplification branch 600. In the first amplification stage there is a pMOS transistor $M_2$ the gate of which is connected to the bias terminal $V_{bias}$ and the source terminal of which to supply voltage potential 606. The second amplification stage consists of two nMOS transistors $M_1$ and $M_3$. The gate terminal of the transistor $M_1$ is connected to an input $I_{in}$ of the transimpedance amplifier. The drain terminal of the transistor $M_2$ is connected to the drain terminal of the transistor $M_1$ as well as to the gate and drain terminals of the transistor $M_3$. The source terminal of the nMOS transistors $M_1$ and $M_3$ are connected to ground or reference potential 608. The drain terminal of the transistor $M_2$ is further connected to the gate terminal of the transistor $M_1'$ of the following amplification stage 602. Similarly, the drain terminal of the transistor $M_2'$ of the second amplification stage 602 is connected to the gate terminal of the transistor $M_1''$ of the third amplification stage 604. The drain terminal of the pMOS transistor $M_2''$ of the third amplification stage is connected to the input $I_{in}$ via the feedback path 606. A source/drain distance of a pMOS transistor $M_4$ and of a nMOS transistor $M_5$ is connected into the feedback path 606. The gate terminal of the pMOS transistor $M_4$ is connected to ground, whereas the gate terminal of the AMOS transistor $M_5$ is connected to a terminal $R_f$_control of the transimpedance amplifier. The drain terminal of the pMOS transistor $M_2''$ of the third amplification stage is also connected to an output $V_{out}$ of the transimpedance amplifier at which the output voltage $U_0$ (see FIG. 9) is present.

In order to keep the transistors in saturation for greater input currents at the input $I_{in}$, the second amplification stage 602 may be changed as opposed to the other amplification stages 600 and 604 with regard to device-specific parameters, such as the gate length. Since the parasitic capacitance of an ohmic feedback resistance significantly diminishes the bandwidth of the system, instead an active feedback by the transistors $M_5$ and $M_4$ was chosen. The actual magnitude of the resistance is adjusted by the voltage at the input $R_f$_control via the nMOS transistor $M_5$. The pMOS transistor $M_4$ serves for the linearization.

It is pointed out that at the output of the transimpedance amplifier V_out a voltage amplifier may ensue to amplify the output voltage $U_0$ (see FIG. 9), in order to obtain a sufficient voltage swing, and to drive the signals from, for example, the CMOS chip. Here, the bandwidth of this ensuing voltage amplifier should advantageously be chosen such that it does not impede the −3 dB bandwidth of the RF read-out of the transimpedance amplifier configuration previously discussed.

Figure 11A:
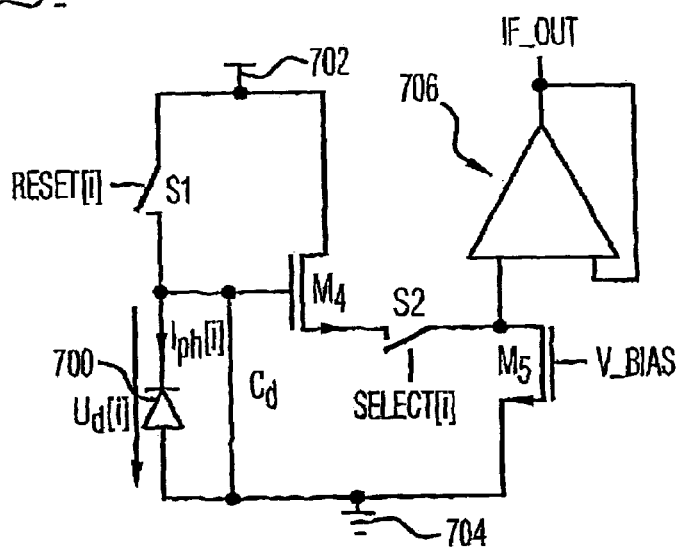
FIG. 11a shows a read-out circuit of the read-out of the LF diodes of the embodiment of FIG. 2.
Figure 11B:
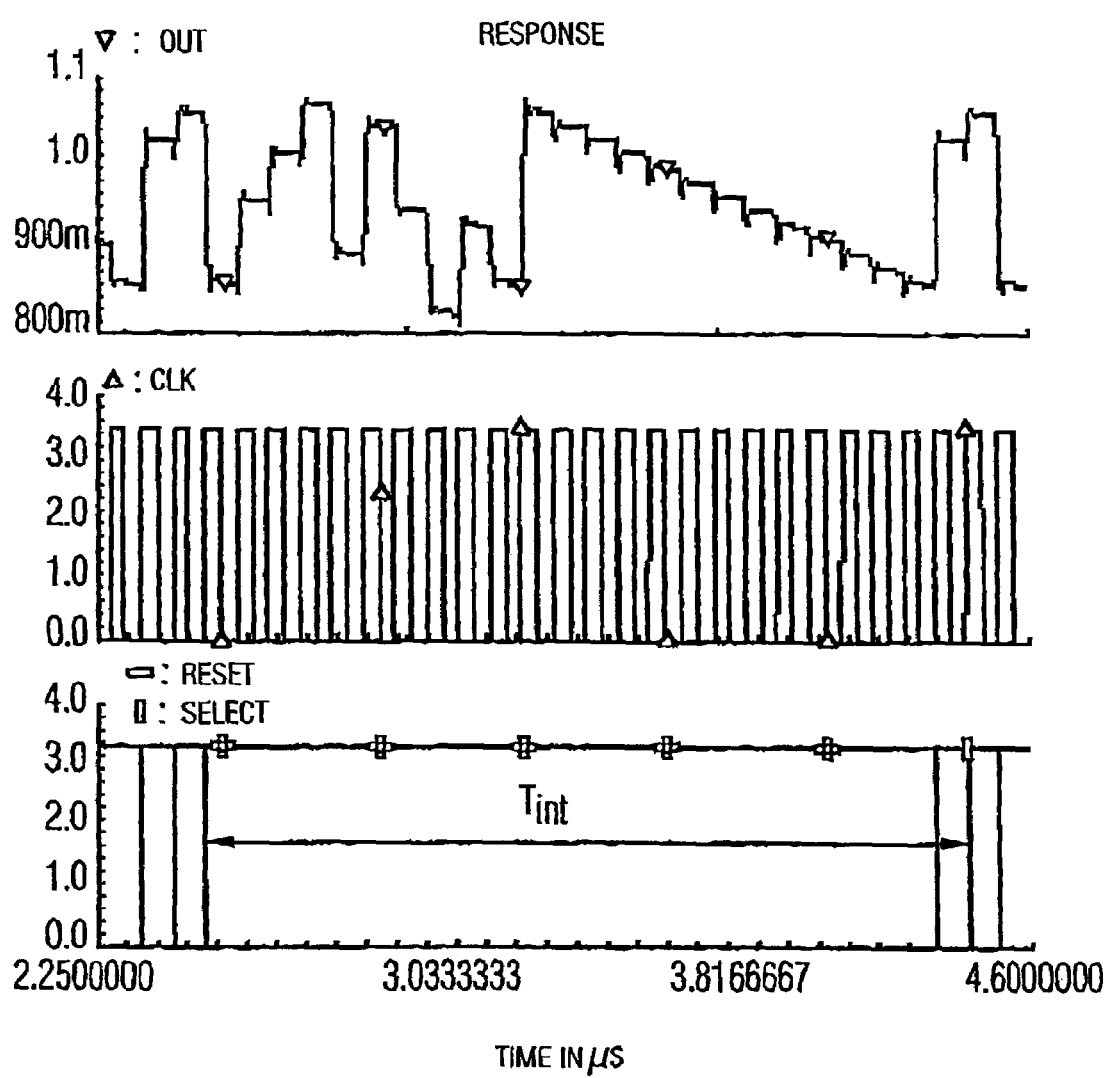
FIG. 11b shows exemplary time waveforms of signals in the circuit of FIG. 11a, for illustrating the cascade read-out of the LF diodes.

FIG. 11a shows the LF read-out circuit for the read-out of the RF diodes. Since the read-out is performed in the kHz range, an integration solution approach is chosen, wherein in particular the barrier layer capacitance of the LF diodes is used to integrate the photocurrent.

At first it is pointed out that in FIG. 11a only part of the read-out circuit of the LF diodes is shown, which is responsible for the read-out of a LF diode provided with the reference numeral 700 in the following, and that in the following at first only this part is described. The LF diode 700 is connected in series to a switch S1 in reverse direction between a supply potential 702 and ground or reference potential 704. In FIG. 11a, the barrier layer or junction capacitance $C_d$ of the LF diode 700 is suggested with dashed lines as a capacitor connected in parallel to the LF diode 700 in equivalent circuit diagram manner. The interconnect between LF diode 700 and the switch S1 is connected to a gate of a nMOS transistor $M_4$ the drain terminal of which is again connected to supply potential 704. The source terminal of transistor $M_4$ is connected to an input of an output amplifier 706 via a switch S2. Between the input of the output amplifier 706 and ground 702, a nMOS transistor $M_5$ is connected with its source/drain distance, whereas its gate terminal is connected to an input v_bias. The transistors $M_4$ and $M_5$ together form a source follower when switch S2 is closed.

After having previously described the construction of the part of the read-out circuit for a LF diode 700, in the following its functioning is described. The voltage across the LF diode 700 $U_d[i]$ is at first adjusted to the supply voltage $V_{dd}$ by turning on the switch S1. As soon as the switch S1 is open, the voltage $U_d[i]$ decreases via the interface capacitance $C_d$ Of the LF diode 700 due to the discharge of the photodiode capacitance $C_d$ by the photocurrent. For the dependence between voltage $U_d$ and the time, the following applies:

$$U_d[i] = V_{DD} - \frac{1}{C_d} \int_{t_{reset}}^{t} I_{ph}[i](\tau)d\tau$$

wherein it is assumed that the diode capacitance $C_d$ is independent of $U_d[i]$, $t_{reset}$ indicates the time instant at which the switch S1 is opened, t indicates the instantaneous time instant, and τ is an integration variable. It is apparent that the voltage swing rises with decrease of $C_d$. $U_d[i]$ is the input voltage to the voltage follower of the transistors $M_4$ and $M_5$ switched by the switch S2. The signal at the source terminal of the transistor $M_5$ of the voltage follower is amplified by the output amplifier 706 to force out the read-out voltage.

For the read-out of all LF diodes, the read-out circuit includes a switch S1, a switch S2, and a transistor $M_4$ for each LF diode. The switches S1 and S2 are controlled by the signals reset (i) and select[i]. The time lapse scheme for the signals select and reset is such that 25 regularly phase-shifted pulses are generated from an input clock. The $i^{th}$ pulse is used to conduct the diode voltage of the $i^{th}$ LF photodiode to the output amplifier 706 for the length of an input clock period. The $(i+1)^{th}$ pulse is used to reset the $i^{th}$ LF photodiode. To each LF photodiode of the 5×5 LF diode array consequently signals reset and select are applied in cascaded manner, which have a pulse at every $25^{th}$ clock period, wherein for each LF diode the pulse of the reset signal immediately follows the pulse of the select signal. Between the resetting of each LF diode and the time instant of its read-out consequently 23 clock periods pass, wherein during the read-out or the multiplexed forwarding the instantaneous photocurrent is added to the stored one. The reset or select signals of all 25 LF diodes are each mutually offset by one clock period, so that all 25 LF diodes are read-out in series or cascaded manner. The output amplifier or output buffer is preferably designed so that its settle time duration is shorter than half the clock period. The clock rate may for example be 25 mHz. In this case, the falling clock edge could be used to sample the output signal of the voltage follower. For the illustration of the read-out scheme, in FIG. 11b examples for temporal courses of the output signal if_out of the amplifier 706, a clock clk for the cascade multiplex control, and, in the lowest graph, the reset and select for a LF diode are shown in three graphs arranged below each other from top to bottom.

By this multiplex read-out operation of the LF diodes, it is guaranteed that for all LF diodes only one output buffer 706 as well as only one pin or only One pad is required when implementing the optical detection device of FIGS. 3–11 as an integrated circuit.

Referring to the previous description, it is pointed out that the described conductivity types, i.e. n conducting and p conducting, might also be reversed, and that also arrangements of the LF diodes other than array are possible.

Referring to the previous description of FIGS. 2–11, it is pointed out that the diode arrangement of FIG. 2a may be integrated to an optical detection means in form of, for example, a chip with one or several or all of the means of FIG. 2a.

As a result, embodiments for signal-detecting diodes consisting of regions with predetermined expansion of the space charge zone were presently provided, in which the diode is shielded with a further space charge zone by a corresponding layout of the diode and using other insulating regions, whereby it is caused that only few diffusing charge carriers reach the signal-detecting diode. The photocurrent generated by this diode consequently consists only in small part of diffusion current and thus has a correspondingly high bandwidth. Moreover, the described quick photodiodes and diode arrangements can be fabricated in the standard CMOS process and nevertheless enable signal detection with high bandwidth. This enables integration in a SOC (system-on-chip) system, which offers significant cost savings. Furthermore, proven circuits or their optimizations may be used for the read-out, so that in this respect no new developments are required. Moreover, no additional circuit blocks are required in the signal path, which would result in a deterioration of the signal quality. In addition, the described photodiodes with simultaneous read-out of the insulating space charge zone region have a linearity of the diode characteristic curve, which may be utilized in application in optical memories, in order to be used as uniform read-out system.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A photodiode, comprising:
   a semiconductor substrate;
   a photosensitive region in the substrate, the photosensitive region having a space charge zone region for generating a drift current portion and a diffusion region for generating a diffusion current portion; and
   an insulator in the semiconductor substrate for at least partially confining the diffusion region from an adjacent surrounding region of the semiconductor substrate,
   wherein the semiconductor substrate is of a first conduction type, and the space charge zone region is formed by a signal region with a second connectivity type in the semiconductor substrate, which is different from the fist conductivity type,
   wherein the insulation means is formed by an insulation region of the second conductivity type in the semiconductor substrate at a predetermined spacing to the signal region, and
   wherein the semiconductor substrate comprises a doping profile having a doping density decreasing in depth direction, such that a bulging of a space charge zone of the insulation region in lower regions of the semiconductor substrate results.

2. The photodiode of claim 1, wherein the signal region comprises a comb structure.

3. The photodiode of claim 1, wherein the predetermined spacing is smaller than the diffusion length of free charge carriers in the semiconductor substrate.

4. The photodiode of claim 1, wherein the predetermined spacing ranges from 1 μm to 7 μm.

5. The photodiode of claim 1, wherein the insulation region has a predetermined depth, which is greater than the depth of a signal region forming the space charge zone region by a predetermined multiple.

6. The photodiode of claim 5, wherein the predetermined multiple is 2 to 10.

7. The photodiode of claim 1, wherein the insulation region comprises several arms formed facing away from each other in star-shaped manner, each arm extending between the photosensitive region and further adjacent photosensitive regions being part of a photodiode array together with the photosensitive region.

8. The photodiode of claim 6, wherein the insulator comprises further insulation regions also forming an array together, the insulation regions and photosensitive regions being arranged such that the photosensitive regions are individually formed in gaps formed by the arms of the insulation regions.

9. The photodiode of claim 1, comprising a contacting conductor connected to the insulation region, for reading out a photocurrent generated in a space charge zone region formed by the insulation region.

* * * * *